United States Patent [19]
Nicholes

[11] Patent Number: 6,101,145
[45] Date of Patent: Aug. 8, 2000

[54] SENSING CIRCUIT AND METHOD

[75] Inventor: James W. Nicholes, Gilbert, Ariz.

[73] Assignee: Motorola, Inc., Schaumburg, Ill.

[21] Appl. No.: 09/216,703

[22] Filed: Dec. 21, 1998

[51] Int. Cl.$^7$ .................................................... G11C 13/00
[52] U.S. Cl. ...................................... 365/230.01; 365/233
[58] Field of Search .......................... 365/189.01, 189.05, 365/230.01, 230.06, 233, 210

[56] References Cited

U.S. PATENT DOCUMENTS 5,946,255  8/1999  Saripezca et al. ........................ 365/210

*Primary Examiner*—Terrell W. Fears
*Attorney, Agent, or Firm*—Anthony M. Martinez; Sharon K. Coleman

[57] ABSTRACT

The occurrence of invalid data transitions on an output data bus (17) are reduced with an improved data sensing circuit (20). In a single block memory application, a self-controlled sense amplifier (21) eliminates the need for external timing control signals by triggering off the rail-to-rail voltage swings of a complementary bit line pair (BIT, BITB) of a memory array coupled to the inputs of the amplifier (21). Triggering off the bit lines (BIT, BITB) ensures that the amplifier (21) is not activated until valid data appears at its input, thereby preventing glitches on the output data bus (17) due to the amplifier (21) or associated latch (13). In a multiblock memory application, the data sensing circuit is further improved by eliminating invalid data transitions from appearing on the output data bus (17) through use of feedback. Data storage devices (13) of inactive blocks are preloaded with the valid data appearing on the output data bus (17) via a feedback circuit (23), thereby preventing potentially invalid data otherwise stored in an in active storage device (13) from being transferred to the output data bus upon activation.

19 Claims, 3 Drawing Sheets

10

20

SENSING CIRCUIT AND METHOD

BACKGROUND OF THE INVENTION

This invention relates to sense amplifiers, and more specifically to an improved sensing circuit and method which reduces the occurrence of invalid data being transmitted to an output data bus.

Timing performance is key to many memory devices. To minimize delay, current methodologies enable memory sense amplifiers prior to new data arriving at the inputs of the sense amplifier. With such an approach, data is sensed immediately upon receipt at the sense amplifier inputs, then driven onto an output data bus. Typically, the data is also stored in a latch or register so that the sense amplifier and the remaining memory circuitry can be powered down or prepared for the next operation cycle while maintaining the data on the output data bus.

With current methodologies, there are numerous ways in which invalid data transitions can be sent to the output data bus before the next valid data appears. These invalid transitions consume AC power, which in low power systems can be significant. One potential source of invalid data is the sense amplifier. Between the time that a sense amplifier is activated and the moment when new data arrives from the memory array, the sense amplifier will try to sense what is appearing at its inputs and will begin to send what is sensed (e.g., invalid data) to the output data bus. If the polarity of what is appearing at the sense amplifier inputs is opposite from the polarity of the data that is appearing on the output data bus and the data to be sensed from the memory array to the sense amplifier inputs, the output data bus will transition from the previous data on the bus, to the invalid data (the data sensed during the time between the sense amplifier being enabled and valid data appearing at its inputs), and finally to the newly sensed valid data.

Another potential source of invalid data is the data storage device of the sense amplifier. When the sense amplifier is activated, the data being stored in the storage device from a previous operation can be sent to the output data bus. If the data being stored from the previous operation is opposite in polarity from what is appearing on the output data bus and from the data to be sensed from the memory array, there will be glitch on the output data bus; meaning, the output data bus will transition from the valid data that was appearing on the bus to the data stored in the storage device from a previous operation then to the newly sensed data from the memory array.

Yet another potential source of invalid output data bus transitions can arise where the memory device is but one of many structures of a larger system that supplies data to the output data bus. When the memory device is activated, there is no guarantee as to what signals will be driven onto the output data bus prior to the sense amplifier sensing the valid data from the memory array and providing that valid data to the output data bus.

One known approach to dealing with invalid output data transitions is simply accept the invalid transitions and any corresponding AC power drain they may cause. This is typically done by setting up the overall system timing around possible occurrences of the invalid transitions. Another known approach to dealing with invalid output data transitions appearing on the output data bus is to design delayed timing paths around the sensing and output driving circuitry of the memory device. Data is typically gated from the memory array to the sense amplifier and from the data storage device to the output drivers. Depending upon the requirements of a particular design, data may also be gated between the sense amplifier and the data storage device. Each gate is opened only after a sufficient period time has elapsed to ensure that the data appearing at the inputs of each gate has stabilized. Because it is difficult to predict precisely when stabilization occurs at each stage, the delays must be set up to mimic the worst case timing paths. Additional delay must also be included to account for fabrication and device or process variations that could adversely impact timing performance.

The known approaches fall short with the increasing need for speed, precision, and low power consumption in products such as cellular phones, pagers, and other portable communication devices and particularly, in low voltage applications. Accordingly, it would be advantageous to have a method and circuitry for sensing data from a memory array and dealing with glitches on the output data bus that did not adversely impact the operating speed. It would be a further advantage to have a method and apparatus for eliminating invalid data transitions from appearing on the output data bus. It would further be advantageous for such methods and circuitry to minimizes the power consumption and thereby conserve battery life in portable applications.

BRIEF DESCRIPTION OF THE DRAWINGS

Various aspects and embodiments of the present invention will be hereinafter described with reference to the drawing figures, in which like reference characters indicate corresponding elements throughout the several views and in which.

DETAILED DESCRIPTION OF THE DRAWINGS

Generally, the present invention provides an improved data sensing circuit and method. More particularly, the occurrence of invalid data transitions on an output data bus are reduced with an improved data sensing circuit. In accordance with one aspect of the present invention, in single and multiblock memory applications, a self-controlled sense amplifier eliminates the need for external timing control signals by triggering off the rail-to-rail voltage swings of a complementary bit line pair of a memory array coupled to the inputs of the amplifier. Triggering off the bit lines ensures that the amplifier is not activated until stable, valid data appears at its input, thereby preventing glitches on the output data bus due to the amplifier or associated latch. In accordance with another aspect of the present invention, in multiblock memory applications, the data sensing circuit is further improved by eliminating invalid data transitions from appearing on the output data bus through use of feedback. Data storage devices of inactive blocks are preloaded with the valid data appearing on the output data bus via a feedback circuit, thereby preventing potentially invalid data otherwise stored in an in active storage device from being transferred to the output data bus upon activation.

Figure 1:
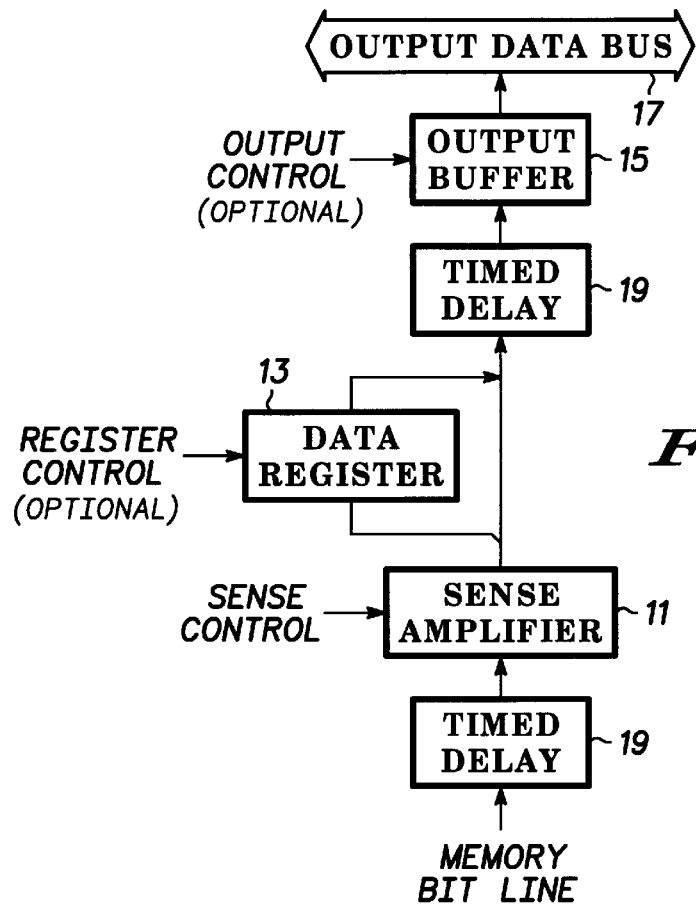
FIG. 1 is a block diagram of prior art bit line sensing scheme

Turning now to the drawings, attention is first directed to FIG. 1 which illustrates a known approach to dealing with invalid data transitions (also referred to herein as glitches) from appearing on an output data bus. Sensing scheme 10 comprises a sense amplifier 11 coupled to a memory bit line of a memory array, a data storage device (also referred to as a data register or latch) 13 coupled to an output of sense amplifier 11, and an output buffer 15 coupled for receiving data from data storage device 13 and sense amplifier 11 and driving the received data to an output data bus 17. Sensing scheme 10 further comprises timed delays 19 coupled to inputs of sense amplifier 11 and output buffer 15.

To reduce the occurrence of invalid data transitions from appearing on output data bus 17, sensing scheme 10 utilizes delay paths in an attempt to ensure that only valid data is passed to output data bus 17. For example, a timed delay 19 is coupled to the input of sense amplifier 11 to ensure that once sense amplifier 11 is activated by an external control signal Sense Control, data appearing on the bit line has stabilized and is valid data. Another timed delay 19 is coupled to the input of output buffer 15 to further ensure that invalid data appearing at the input of output buffer 15 is not driven on to output data bus 17. Timed delay 19 coupled to output buffer 15 delays data output from data storage device 13 and sense amplifier 11 from being provided to output buffer 15 and thus, to output data bus 17. Ideally, timed delay 19 delays the data for a sufficient period of time to ensure that the data being output from data storage device 13 and sense amplifier 11 is valid data.

By adding sufficient delays, sensing scheme 10 is relatively effective in reducing the occurrence of invalid data transitions on output data bus 17. Adding delays, however, adversely impacts the timing performance. Moreover, to account for factors such as fabrication, device, and process variations additional delay must be added, further degrading timing performance. Thus, approaches such as that illustrated in FIG. 1 are not desirable in applications where timing performance is a critical parameter.

Figure 2:
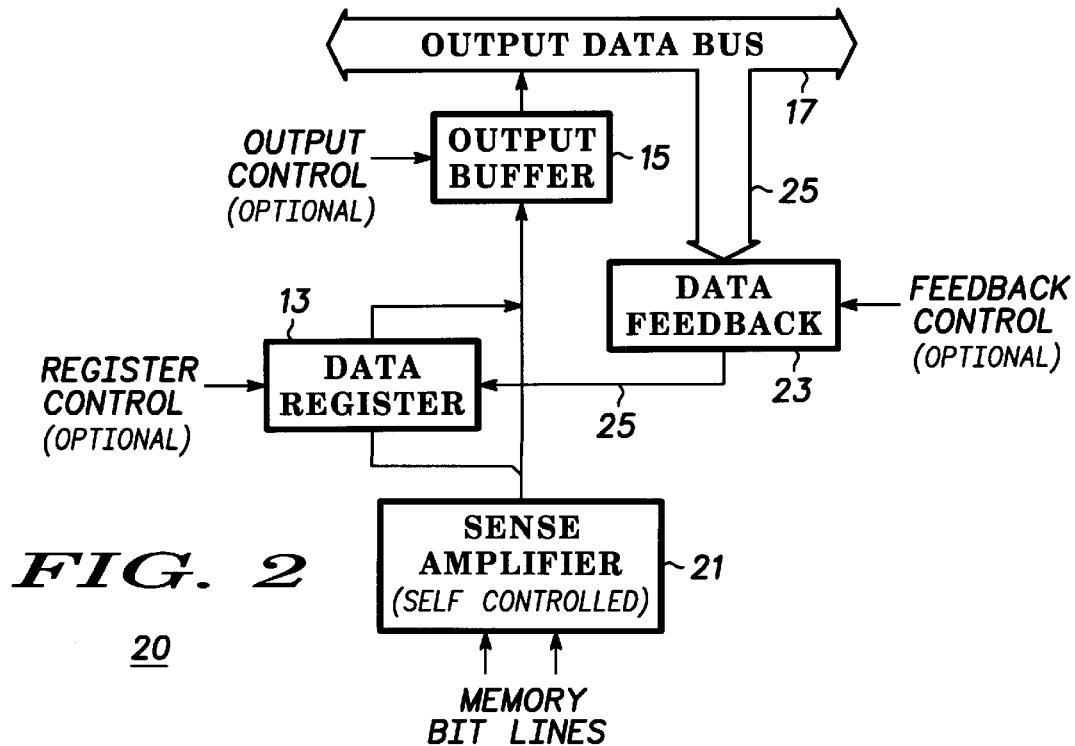
FIG. 2 is a block diagram of a sensing scheme in accordance with an embodiment of the present invention.

FIG. 2 illustrates a sensing scheme 20 in accordance with the present invention. Sensing scheme 20 comprises sense amplifier 21 coupled for sensing data from a memory bit line of a memory array, data storage device 13 coupled between sense amplifier 21 and output data bus 17, and a data feedback circuit 23 coupled between output data bus 17 and data storage device 13. Sensing scheme 20 further comprises output buffer 15 coupled for receiving data from data storage device 13 and sense amplifier 21 and driving the received data on to output data bus 17.

In accordance with one aspect of the present invention, sense amplifier 21 comprises a self-controlled logic amplifier. More particularly, sense amplifier 21 has dual inputs individually coupled to a memory bit line of a complementary bit line pair BIT and BITB of the memory array for sensing data appearing on the bit lines. Sense amplifier 21 triggers off the complementary bit line pair BIT and BITB and is controlled by the rail-to-rail voltage swings of bit lines BIT and BITB. When bit lines BIT and BITB are both a logic high (also referred to as a logic one), sense amplifier 21 is OFF. Sense amplifier 21 performs its sensing function only when one of the bit lines of complementary bit line pair BIT, BITB coupled to one of its inputs is pulled to a logic low (also referred to as logic zero) by a selected memory cell within the memory array. Thus, sense amplifier 21 is activated by the bit lines coupled to its inputs; meaning, sense amplifier 21 is self-controlled, eliminating the need for external control or triggering as is necessary in known methodologies, such as that illustrated in FIG. 1.

In most memory applications, e.g., Static Random Access Memory (SRAM) applications, the sense amplifier is turned on prior to valid data appearing at its inputs to avoid wasting time. When the sense amplifier is turned on, however, the latch or register circuit (which holds data) can send the stored data (potentially invalid data) to the output data bus. As those skilled in the art will appreciate, eliminating external control is beneficial because it eliminates the delay intentionally added to ensure that the data appearing at the inputs of the sense amplifier has stabilized before being sensed. In accordance with this aspect of the present invention, self-controlled sense amplifier 21 triggering off the bit lines ensures, without adding undesirable delay, that sense amplifier 21 is not functioning until valid data is present at its inputs.

Triggering off the rail-to-rail voltage swing of bit lines BIT and BITB is particularly applicable to low voltage applications; particularly, those where the operating voltage, e.g. Vdd, is approaching or below the sum of the threshold voltages of the PMOS and NMOS sensing transistors (i.e, Vdd≦Vtp+Vtn, where Vtp is the threshold voltage of the PMOS sensing transistor and Vtn is the threshold voltage of the NMOS sensing transistor). The need for low voltage, low power memory devices is quickly increasing, particularly in portable communication device applications. Traditionally, an analog sense amplifier was used to sense a voltage differential between complimentary bit lines of, for example, a Static Random Access Memory (SRAM) array. To conserve AC power, the bit lines are typically clamped to prevent the bit lines from swinging rail-to-rail, i.e., from a most positive supply voltage (e.g., Vdd) to a most negative supply voltage (e.g., Vss). While AC power may be conserved, clamping the bit lines allows DC power to flow through every addressed memory cell. In addition to the DC power in the memory cells, analog sense amplifiers consume DC power further adding to the overall power consumption. In addition to power consumption concerns, analog sense amplifiers are not suitable for low voltage applications. Analog sense amplifiers generally drop off in performance or cease to function altogether when the operating potential, e.g., Vdd, begins to approach Vtn+Vtp, the sum of the threshold voltages of the NMOS and PMOS sensing transistors, respectively. The drop in performance and/or the ceasing to function is due to the analog sense amplifier needing a range of voltage where both the NMOS and the PMOS sensing transistors are on and with low operating voltages, there is not a region where both transistors will be on. Because of the low operating voltages, the sense amplifier must operate rail-to-rail.

Digital sense amplifiers (also referred to a logic amplifiers), on the other hand, can operate at and below voltages i.e., voltages approximately at or below Vdd=Vtn+Vtp. In addition, digital sense amplifiers do not have the DC power component found in analog sense amplifiers. Digital sense amplifiers are also commonly used in rail-to-rail, e.g., from Vdd to Vss, applications. While the AC power component of the bit line swing in a rail-to-rail application will be higher than a clamped bit line, but there will be no DC power from the memory cells.

Referring again to FIG. 2, data sensed by sense amplifier 21 is output from sense amplifier 21 and provided to an input of data storage device 13. Data storage device 13 receives the data and latches or stores the data for transmission to output data bus 17. Data storage device 13 suitably comprises a data register or latch or other mechanism suitable of storing data. Data output from sense amplifier 21 and input to data storage device 13 can be either be dynamically latched using external control signals or simply overwritten by new incoming data.

Typically, data from data storage device 13 is provided to output data bus 17 via output buffer 15, although not required for all applications. When used, output buffer 15 receives the data from output storage device 13 and drives the data onto output data bus 17. As is well known, output buffers are typically used to increase the drive capability and to provide any additional functional variations necessary for driving the output bus of a particular application.

As is well known, a memory array may be a single block or a multiblock architecture. A block, for example in the case of an SRAM device, is characterized pair of complementary bit lines and a word line (also referred to as rows and columns). For each block of a multiblock array, there is sensing circuitry, such as that being discussed with respect to the present invention and illustrated in FIG. 2. As is also known, only one block of the array is active at a given time. In accordance with another aspect of the present invention, to prevent invalid data transitions or glitches that can occure when a previously unselected block is selected, the data storage devices of the unselected blocks of the memory array are preloaded with the valid data appearing on the data bus. Thus, when a previously unselected block is selected, if the data stored in the previously inactive storage device is transmitted to the output data bus prior to receiving the new data, the transmitted data will be what is already appearing on the bus; the data will be of the same polarity, thus eliminating any glitch or invalid transition.

In accordance with this aspect of the invention, data feedback circuit 23 suitably preloads an unselected or inactive data storage device 13 of a mulitblock memory array with valid data appearing on output data bus 17. Data feedback circuit 23 has an input coupled to output data bus 17 and an output coupled to data storage device 13 creating a feedback path 25 from output data bus 17 to data storage device 13. It should be noted for ease of illustration, FIG. 2 shows sensing circuitry 20 of a single block. It should be understood, however, that preferrably all inactive storage devices 13 are preloaded with the data appearing on bus 17.

In further accordance with this aspect of the present invention, the preloading of data may be controlled in a variety of ways. For example, the control may be internal to the memory device. For example, valid data appearing on output data bus 17 may be automatically fed or loaded in to data storage devices 13 of the inactive memory blocks with each read or write cycle. Alternatively or additionally, the preloading of data may be controlled by a source external to the memory array or memory device. External control is particularly desirable where circuitry in addition to the memory array is coupled to and utilizing output data bus 17. In such an application, all data storage devices of the memory array may be preloaded with the data appearing on the bus (note, that data may not be on the bus due to the memory array), prior to the memory device being activated from a previous disabled condition or state.

Figure 3:
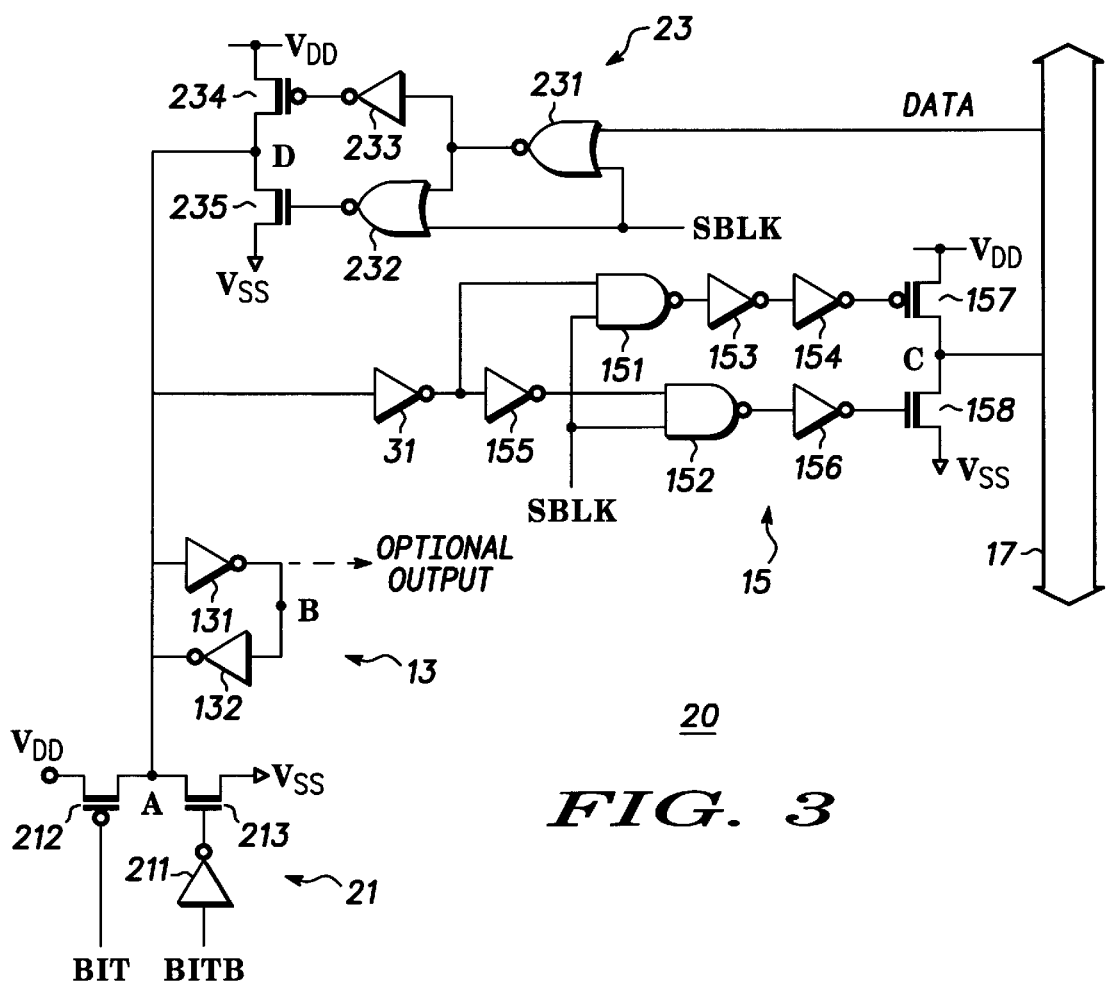
FIG. 3 is a logic level schematic diagram of a sensing scheme in accordance with an embodiment of the present invention.
Figure 4:
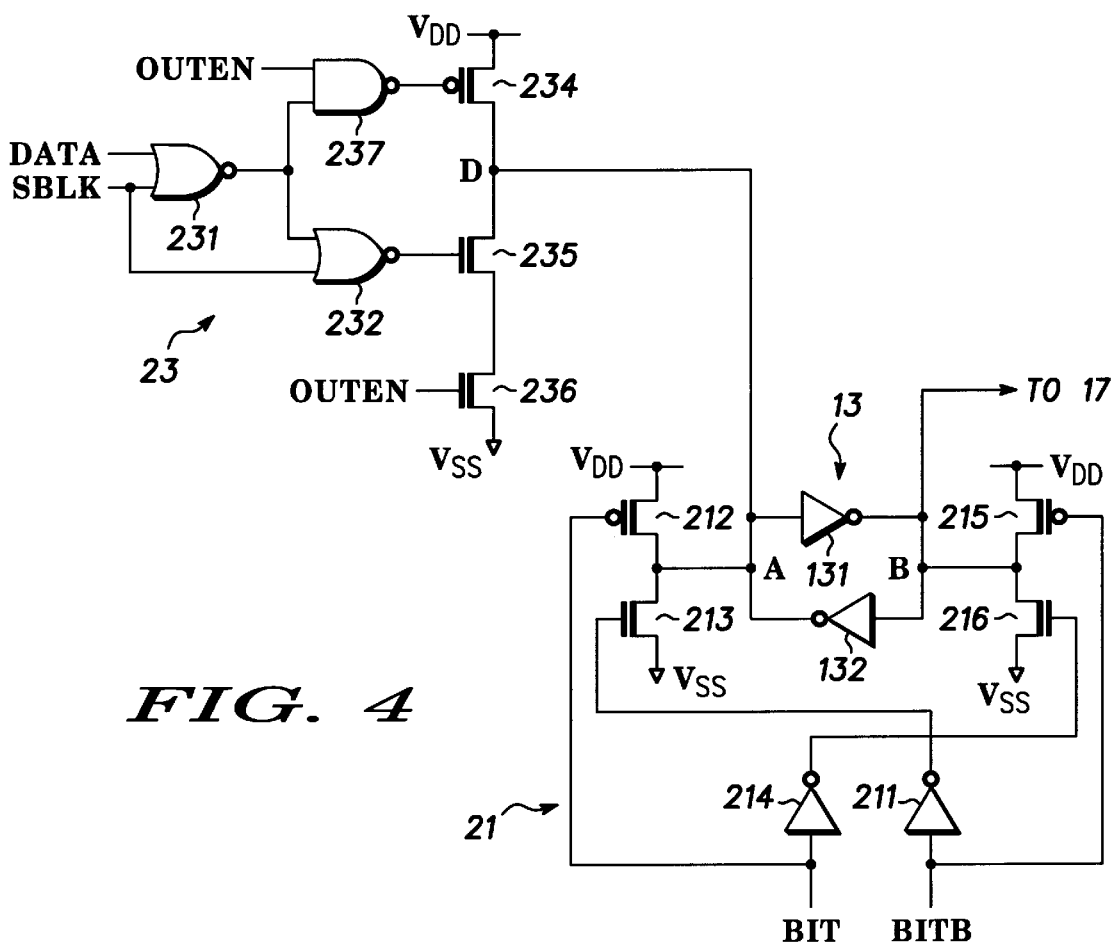
FIG. 4 is a logic level schematic diagram of a sensing scheme in accordance with an embodiment of the present invention.

From a circuit design stand point, as those skilled in the art will appreciate, there are a number of ways to implement the methodology of the present invention. FIGS. 3 and 4 illustrate just a couple of those ways.

FIG. 3 illustrates a logic level diagram of an embodiment of sensing scheme 20 of FIG. 2. Sense amplifier 21 suitably comprises a transistors 212 and 213 each having current carrying electrodes and a control electrode corresponding to a drain, a source, and a gate, respectively. Transistors 212 and 213 respectively comprise the sensing PMOS and NMOS transistors. Sense amplifier 21 further comprises an inverter 211. Inverter 211 has an input node coupled for receiving data from the complementary bit line BITB of the bit line pair. Inverter 211 further has an output node connected to the gate of transistor 213. The gate of transistor 212 is coupled for sensing data from the bit line BIT of the bit line pair. The drain of transistor 212 is coupled to a power supply terminal for receiving an operating potential, e.g., Vdd. The source of transistor 212 is coupled to the drain of transistor 213 forming a node A. The source of transistor 213 is coupled to a power supply terminal for receiving an operating potential, e.g., Vss or ground.

In operation, bit lines BIT and BITB are equilibrated high, as is common. When bit lines BIT and BITB are both pulled high, transistors 212 and 213 are OFF. If bit line BIT falls, transistor 212 turns ON, which pulls node A high, if not already high due to previous data, and writes a logic one in to data storage device 13. On the other hand, if complementary bit line BITB falls, inverter 211 inverts the signal to a logic high which turns ON transistor 213, pulling node A low and writing a logic zero in to data storage device 13. As discussed, because sense amplifier 21 uses both bit lines BIT and BITB, no external timing or activation is necessary. More particularly, complementary bit line pair BIT and BITB are coupled to the memory array bit lines and it is the memory bit lines that control sense amplifier 21 as opposed to a timing path or other circuitry e.g. from clock, decoder, delay path. This is made possible by allowing bit lines BIT and BITB to swing rail-to-rail. While possible, if a partial bit line swing is used, a level transition detector or driver circuitry is necessary and typically, this extra circuitry requires external triggering reducing the benefit of a self-controlled sense amplifier.

Data storage device 13 is coupled to node A for receiving data sensed by sense amplifier 21. Data storage device 13 suitably retains or stores the previous valid data provided to output data bus 17 until sense amplifier 21 is enabled by bit lines BIT and BITB. Data storage device suitably comprises inverters 131 and 132. Inverters 131 and 132 form a latch that holds the data. Inverter 131 has an input terminal coupled at node A to sense amplifier 21 and a output terminal. Inverter 132 has an input terminal coupled to the output terminal of inverter 131 and an output terminal coupled to sense amplifier 21 at node A. The output of data storage device 13 may be taken from the input side inverter 131 or alternatively from the output side of inverter 131.

When the output from data storage device 13 is taken from the sense amplifier 21 side (the input side of inverter 131) as illustrated in FIG. 3, the data is provided to an inverter 31 coupled between data storage device 13 and output buffer 15. Inverter 31 inverts the data and passes the inverted data to output buffer 15.

As those in the art will appreciate, there are numerous ways to configure or design an output buffer depending on the requirements of the particular application. One such configuration is illustrated in FIG. 3. As illustrated in FIG. 3, output buffer 15 comprises NAND gates 151 and 152; inverters 153, 154, 155, and 156; and transistors 157 and 158. Transistors 157 and 158 respectively comprise a PMOS and an NMOS transistor, each having a pair of current carrying electrodes and a control electrode corresponding to a drain, a source and a gate, respectively. Output buffer 15 is activated by a block control signal SBLK which is provided to NAND gates 151 and 152. Data sensed by sense amplifier 21 is latched into storage device 13 and provided to output buffer 15 via inverter 31. The data is received by output buffer 15 and provided to an input of NAND gate 151. Similarly, the data received by output buffer 15 is inverted by inverter 155 and provided to an input of NAND gate 152. The output of NAND gate 151 is passed through inverters 153, 154 and provided to the gate of transistor 157. The output of NAND gate 152 is passed through inverter 156 and provided to the gate of transistor 158. The drain of transistor 157 is coupled to a power supply terminal for receiving an operating potential, e.g., Vdd. The drain of transistor 158 is coupled to the source of transistor 157 forming a node C. The source of transistor 158 is coupled to a power supply terminal for receiving an operating potential, e.g., Vss or ground. Output buffer 15 is coupled at node C to data output bus 17 for driving data received at the input of buffer 17 onto data output bus 17. In operation, either transistor 157 or transistor 158 will drive the data onto bus 17, depending on the polarity of the data at the input of output buffer 17.

In a multiblock memory application, data appearing on output data bus 17 is fed back to data storage circuit 13 via feedback circuit 23. The data is fed from output data bus 17 to feedback circuit 23, then to data storage circuit 13, forming a feedback path 25 (FIG. 2). Feedback circuit 23 comprises NOR gates 231 and 232, inverter 233, and transistors 234 and 235. Transistor 234 comprises a PMOS transistor having a current carrying electrode corresponding to a drain, a current carrying electrode corresponding to a source, and a control electrode corresponding to a gate. Similarly, transistor 235 comprises an NMOS transistor having a current carrying electrode corresponding to a drain, a current carrying electrode corresponding to a source, and a control electrode corresponding to a gate. The drain of transistor 234 is coupled to a power supply terminal for receiving an operating potential, e.g., Vdd. The source of transistor 234 is coupled to the drain of transistor 235 forming a node D. The source of transistor 235 is coupled to a power supply terminal for receiving a power supply voltage, e.g., Vss or ground. Feedback circuit 23 is suitably coupled at node D to node A; thus, coupled to data storage circuit 13.

In a multiblock memory application, a block decoding or control signal SBLK turns the memory array block on and off (enables and disables the array block). The block control signal SBLK (also referred to as block decoding signal) activates the array and a particular block, allowing data to come into the sense amplifier and processed onto the output data bus. Block decoding signal SBLK, turns off feedback path 25 for the active block. Meaning, the data on output bus 17 will not be fed back to data storage device 13 of the active block. Meanwhile, block decoding signal SBLK turns on feedback path for an inactive block to allow the data storage devices of the disabled or non-selected block to be preloaded with the data appearing on output data bus 17. The non-selected blocks are disabled from sensing data from the memory array but are enabled for receiving and storing data from output data bus 17.

FIG. 4 illustrates some alternate circuit implementations of select components of sensing scheme 20. In accordance with a preferred embodiment, sense amplifier 21 further comprises inverter 214 and transistors 215 and 216. Inverter 214 has an input terminal and an output terminal and may be formed by well known means. Transistor 215 comprises a PMOS transistor having a current carrying electrode corresponding to a drain, a current carrying electrode corresponding to a source, and a control electrode corresponding to a gate. Similarly transistor 216 comprises an NMOS transistor having a current carrying electrode corresponding to a drain, a current carrying electrode corresponding to a source, and a control electrode corresponding to a gate. Similar to transistors 211 and 213, the drain of transistor 215 is coupled to a power supply terminal for receiving an operating potential, e.g., Vdd. The source of transistor 215 is coupled to the drain of transistor 216 and each are coupled to data storage device 13 at node B. The source of transistor 216 is coupled to a power supply terminal for receiving a power supply voltage, e.g., Vss or ground. To balance the load data storage device 13 sees at node A, additional circuitry (not shown) may be coupled to data storage device at node B.

Transistors 212, 213, 215, and 216 pull opposite sides of data storage device 13 either up or down depending on the polarity of the data coming into sense amplifier 21 from complementary bit line pair BIT, BITB. When both bit lines BIT and BITB are equilibrated high, sense amplifier is inactive or OFF. If the data coming from an addressed memory cell of the memory array is a logic zero, bit line BIT will drop from a logic high to a logic low. The dropping of bit line BIT turns ON transistor 212, driving the node A side of data storage device 13 high. Bit line BIT dropping to a logic zero is inverted by inverter 214 to a logic high, which turns ON transistor 216, driving the node B side of data storage circuit 13 low. Complementary bit line BITB remains high, thus transistors 213 and 215 will remain OFF; meaning, neither transistor 213 nor transistor 215 will drive either side node A or node B of data storage device 13. On the other hand, if the data coming from an addressed memory cell of the memory array is a logic one, complementary bit line BITB will drop from a logic high to a logic low causing transistors 213 and 215 to turn ON and provide the pull up and pull down of both sides node A and node B of data storage device 13. The arrangement of transistors 212, 213, 215, and 216 suitably provide a symmetrical push-pull arrangement which suitably enhance the timing performance of sense amplifier 21 particularly when sensing a logic high at its inputs.

In accordance with an alternate and preferred embodiment, data feedback circuit comprises NOR gates 231 and 232, NAND gate 237, and transistors 234, 235, and 236. In accordance with the preferred embodiment, NAND gate 237 is used in lieu of inverter 233 (FIG. 2). NAND gate 237 has an input terminal coupled to the output terminal of NOR gate 231 and another input terminal coupled for receiving an enable signal OUTEN. NAND gate 237 further has an output terminal coupled to the gate of transistor 234. Transistor 236 comprises an NMOS transistor having a current carrying electrode corresponding to a drain, a current carrying electrode corresponding to a source, and a control electrode corresponding to a gate. Transistor 236 is coupled between the source of transistor 235 and the power supply terminal. Particularly, the drain of transistor 236 is coupled to the source of transistor 235 and the source of transistor 236 is coupled to a power supply terminal for receiving an operating potential, e.g., Vss or ground. The gate of transistor 236 is coupled for receiving the enable signal OUTEN. For purposes of the following functional description, enable signal OUTEN is at a logic high.

In an active or selected block of a multiblock memory architecture, block control signal SBLK will be high causing the output of NOR gate 231 to be low. A low at the output of NOR gate 231 results in a logic high at the output of NAND gate 237. A logic high at the output of NAND gate 237 holds transistor 234 OFF. A high block signal SBLK also drives the output of NOR gate 232 low, keeping transistor 235 OFF. Thus, disabling feedback circuit 23 in an active block. Node A is suitably tristated from feedback path 25, allowing feedback circuit 23 to be disabled while nodes A and B are driven by sense amplifier 21 and data storage device 13.

If data from a memory device is being provided from and sensed by a different block of memory, the data from the output data bus, in accordance with the present invention, needs to be passed into the inactive data storage devices 13. In so doing, if an inactive storage device 13 becomes active on the next clock cycle, the data it provides to output data bus 17 prior to sensing new data will be the same as the data then on the bus. By loading the inactive storage device 13 with valid data from output data bus 17, invalid data transitions or glitches (1-0-1 or 0-1-0) on output bus 17 are prevented.

In an inactive block, complementary bit lines BIT and BITB will both be high and no writing of data into data storage device 13 will occur from sense amplifier 21. Further, in an inactive block, block control signal SBLK will be low. If the feedback signal DATA from output data bus 17 is also low, the output of NOR gate 231 will be driven high. A logic high at the output of NOR gate 231 keeps the output of NOR gate 232 low, thus keeping transistor 235 OFF. The logic high at the output of NOR gate 231 along with the logic high of feedback enable signal OUTEN will drive the output of NAND gate 237 low. The logic low at the output of NAND gate 237 turns transistor 234 ON, pulling node A high and writing the data from output data bus 17 into data storage device 13.

If feedback signal DATA is high, the output of NOR gate 231 will be driven low. The logic low at the output of NOR gate 231 along with the logic low of block control signal SBLK results in the output of NOR gate 232 being driven high. The logic high at the output of NOR gate 232 turns transistor 235 ON. Transistor 236 is also ON due to feedback enable signal being high. Transistors 235 and 236 being ON drives node A low, writing the data from output data bus 17 into data storage device 13.

In the case where sense amplifier 21 and data storage device 13 is to be completely disabled, either from the entire memory being disabled or due to implementation of a byte accessibility option of the application, feedback enable signal OUTEN will be low. When feedback enable signal OUTEN is low, the output of NAND gate 237 is driven high and transistor 234 is thereby turned OFF. In response to the logic low of feedback enable signal OUTEN at the gate of transistor 236, transistor 236 is OFF and feedback path 25 driving node A is tristated into data storage device 13.

By now it should be appreciated that the present invention provides an improved sensing circuit and method. In single and multiblock memory architectures, self-controlled sense amplifier 21 triggers off complementary bit lines BIT and BITB eliminating the need for external controls and preventing invalid data from being sensed and driven onto output data bus 17. The sensing circuit and method are further improved in a multiblock memory application by preloading data storage device 13 of inactive blocks with the valid data appearing on output data bus 17. In so doing, if an inactive block is activated, any data transmitted to output data bus 17 prior to sensing new data will be the same as the data on the bus, thus preventing an invalid transition or glitch.

The references and embodiments described herein are for example purposes to aid in the teaching of the invention. Particularly, while the various aspects and embodiments of the present invention have been discussed in reference to logic sense amplifiers, the present invention is not so limited. For example, the feed back approach to preventing invalid data transitions may be employed with analog sense amplifiers. Moreover, the present invention, while particularly beneficial in low voltage applications, is applicable generally to any application using rail-to-rail bit line transitions. Additional uses, forms, modifications, variations, and improvements will be evident to those skilled in the art. To the extent that such uses, forms, modifications, variations, and improvements do not depart from the spirit of the invention, they are intended to be included within the scope thereof, which is assessed only by a fair interpretation of the following claims.

I claim:

1. A sensing circuit for sensing data from a memory array and providing the sensed data to an output data bus, the circuit comprising:
    a sense amplifier coupled to the memory array;
    a data storage device coupled between the sense amplifier and the output data bus; and
    a data feedback circuit having an input terminal coupled to the output data bus and an output terminal coupled to the data storage device.

2. The circuit of claim 1 wherein the sense amplifier comprises a logic sense amplifier having a first input terminal for coupling to a first bit line of a complementary bit line pair and a second input terminal for coupling to a second bit line of the complementary bit line pair, wherein the logic sense amplifier is triggered off signals appearing coupled to the first input terminal and the second input terminal.

3. The circuit of claim 1 wherein the sense amplifier comprises:
    a first transistor of a first conductivity type having a current carrying electrode coupled to the data storage device and a control electrode for coupling to a bit line of a complementary bit line pair of the memory array;
    a first inverter having an input terminal for coupling to a complementary bit line of the complementary bit line pair; and
    a second transistor of a second conductivity type having a current carrying electrode coupled to the current carrying electrode of the first transistor and a control electrode coupled to an output terminal of the first inverter.

4. The circuit of claim 3 wherein the sense amplifier further comprises:
    a third transistor of the first conductivity type having a current carrying electrode coupled to the data storage device and a control electrode coupled to the input terminal of the first inverter;
    a second inverter having an input terminal for coupling to the bit line of the complementary bit line pair;
    a fourth transistor of the second conductivity type having a current carrying electrode coupled to the current carrying electrode of the third transistor and a control electrode coupled to an output terminal of the second inverter.

5. The circuit of claim 1 wherein the data storage device comprises:
    a first inverter having an input terminal coupled to the sense amplifier and an output terminal; and
    a second inverter having an input terminal coupled to the output terminal of the first inverter and an output terminal coupled to the input terminal of the first inverter.

6. The circuit of claim 1 further comprising an output buffer having an input terminal coupled to the data storage device and an output terminal coupled to the output data bus.

7. The circuit of claim 6 further comprising an inverter coupled between the data storage device and the input terminal of the output buffer.

8. The circuit of claim 1 wherein the data feedback circuit comprises:
   a first NOR gate having an input coupled to the output data bus;
   a second NOR gate having an input coupled to an output of the first NOR gate;
   an inverter having an input coupled to the output of the first NOR gate;
   a first transistor of a first conductivity type having a control electrode coupled to an output of the inverter and a current carrying electrode coupled to the output terminal of the data feedback circuit; and
   a second transistor of a second conductivity type having a control electrode coupled to an output of the second NOR gate and a current carrying electrode coupled to the output terminal of the data feedback circuit.

9. The circuit of claim 1 wherein the data feedback circuit comprises:
   a first NOR gate having an input terminal coupled to the output data bus;
   a second NOR gate having an input terminal coupled to an output terminal of the first NOR gate;
   a NAND gate having a first input terminal coupled to the output terminal of the first NOR gate and a second input terminal coupled for receiving an enable signal;
   a first transistor of a first conductivity type having a control electrode coupled to an output terminal of the NAND gate and a current carrying electrode coupled to the output terminal of the data feedback circuit;
   a second transistor of a second conductivity type having a control electrode coupled to an output of the second NOR gate and a first current carrying electrode coupled to the output terminal of the data feedback circuit; and
   a third transistor of the second conductivity type having a control electrode coupled for receiving the enable signal and a current carrying electrode coupled to a second current carrying electrode of the second transistor.

10. A self-controlled sense amplifier for sensing data from a memory array, the amplifier comprising:
   a first input terminal for coupling to a first bit line of a complementary bit line pair of the memory array;
   a second input terminal for coupling to a second bit line of the complementary bit line pair; and
   means for sensing data appearing at the first input terminal and the second input terminal, the means coupled between the first and second input terminals and an output terminal of the self-controlled sense amplifier.

11. The amplifier of claim 10 wherein the means for sensing comprises:
   a first transistor of a first conductivity type having a current carrying electrode coupled to a first output terminal of the amplifier and a control electrode coupled to the first input terminal;
   a first inverter having an input terminal coupled to the second input terminal; and
   a second transistor of a second conductivity type having a current carrying electrode coupled to the current carrying electrode of the first transistor and a control electrode coupled to an output terminal of the first inverter.

12. The amplifier of claim 11 wherein the means for sensing further comprises:
   a third transistor of a first conductivity type having a current carrying electrode coupled to a second output terminal of the amplfier and a control electrode coupled to the second input terminal;
   a second inverter having an input terminal coupled to the first input terminal; and
   a fourth transistor of the second conductivity type having a current carrying electrode coupled to the current carrying electrode of the third transistor and a control electrode coupled to an output terminal of the second inverter.

13. The amplifier of claim 12 wherein the first input terminal is coupled to the first bit line of the complementary bit line pair and the second input terminal is coupled to the second bit line of the complementary bit line pair.

14. The amplifier of claim 13 wherein the self-controlled sense amplifier comprises a logic sense amplifier responsive to logic signals received at the first input terminal and the second input terminal, wherein the logic signals transition between a positive most supply voltage and a negative most supply voltage.

15. A method for controlling data transitions on an output data bus of a semiconductor device having a memory array comprising the steps of:
   sensing data appearing on a bit line of the memory array;
   driving the sensed data onto the output data bus; and
   providing a feedback signal representative of the sensed data appearing on the output data bus to inactive memory blocks of the memory array coupled to the output data bus.

16. The method of claim 15 further comprising the step of disabling the feedback signal to an active memory block of the memory array.

17. The method of claim 15 further comprising the step in response to the feedback signal, storing the sensed data in the inactive memory blocks of the memory array.

18. The method of claim 17 wherein the step of sensing data comprises the steps of:
   activating a sensing means with a signal transitioning from a first logic level to a second logic level provided at an data input of the sensing means;
   sensing with the sensing means data appearing on the bit line of the memory array; and
   latching the sensed data in a data storage means.

19. The method of claim 18 the step of driving the sensed data onto the output data bus comprises the step of:
   driving the sensed data latched in the data storage means into an output buffer; and
   wherein the output buffer drives the sensed data onto the output data bus.

* * * * *